(12) United States Patent
Eberler et al.

(10) Patent No.: US 8,814,572 B2
(45) Date of Patent: Aug. 26, 2014

(54) PHANTOM, PARTICULARLY FOR USE IN MR- OR PET-BASED IMAGING METHODS

(75) Inventors: Ludwig Eberler, Neumarkt.i.d.OPf. (DE); Matthias Fenchel, Erlangen (DE); Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 407 days.

(21) Appl. No.: 13/206,579

(22) Filed: Aug. 10, 2011

(65) Prior Publication Data
US 2012/0040322 A1    Feb. 16, 2012

(30) Foreign Application Priority Data
Aug. 11, 2010  (DE) .......................... 10 2010 034 000

(51) Int. Cl.
    *G09B 23/28*       (2006.01)
(52) U.S. Cl.
    USPC ........................................................ 434/267
(58) Field of Classification Search
    USPC .......... 434/262, 267, 268, 272, 274; 73/866.4
    See application file for complete search history.

(56) References Cited

U.S. PATENT DOCUMENTS

| | | | |
|---|---|---|---|
| 4,818,943 A | | 4/1989 | Chandra |
| 5,036,280 A | | 7/1991 | Chesavage |
| 6,629,469 B2 * | 10/2003 | Jaszczak et al. ............. 73/866.4 |
| 6,744,039 B1 * | 6/2004 | DiFilippo ................... 250/252.1 |
| 7,368,912 B2 | 5/2008 | Kreibich |
| 7,675,028 B2 * | 3/2010 | Breuer et al. ............. 250/252.1 |
| 7,768,261 B2 | 8/2010 | Paul et al. |
| 8,459,095 B2 * | 6/2013 | Morris et al. .................. 73/1.82 |
| 2002/0170339 A1 * | 11/2002 | Passi et al. ..................... 73/1.86 |
| 2008/0054901 A1 | 3/2008 | Eberler et al. |
| 2008/0265882 A1 | 10/2008 | Wiggins |
| 2008/0269594 A1 | 10/2008 | Paul et al. |
| 2011/0076660 A1 * | 3/2011 | Morris et al. ................. 434/274 |
| 2011/0207103 A1 * | 8/2011 | Trotta et al. .................. 434/267 |

FOREIGN PATENT DOCUMENTS

| | | |
|---|---|---|
| CN | 101133953 A | 3/2008 |
| DE | 102005045679 B3 | 3/2007 |
| JP | 59015844 A | 1/1984 |

OTHER PUBLICATIONS

R. Weise et al., "Ein dynamisches Herzphantom für die Qualitätskontrolle in der nuklearkardiologischen Funktionsdiagnostik", Z. Med. Phys. 15 (2005), pp. 274-278; Book; 2005.
T. Miyati et al., "MTF Measurement in MRI Using a Complex Subtraction Method", Jap. J. Radiol. Technol. 57 (2001), pp. 1225-1232; Book; 2001.
German priority document DE 10 2010 034 000.6 filed Aug. 11, 2010, not yet published.

* cited by examiner

*Primary Examiner* — Kurt Fernstrom
(74) *Attorney, Agent, or Firm* — Harness, Dickey & Pierce, P.L.C.

(57) ABSTRACT

A phantom, particularly for use in MR- or PET-based imaging methods, includes a hollow base body that delimits an interior volume, wherein the interior volume is subdivided into at least two volume portions by at least one separation element, and wherein the separation element or a section thereof consists of foam.

20 Claims, 3 Drawing Sheets

US 8,814,572 B2

PHANTOM, PARTICULARLY FOR USE IN MR- OR PET-BASED IMAGING METHODS

PRIORITY STATEMENT

The present application hereby claims priority under 35 U.S.C. §119 on German patent application number DE 10 2010 034 000.6 filed Aug. 11, 2010, the entire contents of which are hereby incorporated herein by reference.

FIELD

At least one embodiment of the invention generally relates to a phantom, particularly for use in MR- or PET-based imaging methods, comprising a hollow base body that delimits an interior volume, wherein the interior volume is subdivided into at least two volume portions by at least one separation element.

BACKGROUND

In magnetic resonance (MR)-based imaging methods, there may be deviations in the magnetic fields, more particularly in the spatial distribution of their magnetic field strengths, from their theoretically prescribed and calculated values, as a result of which image-geometrical distortions occur. This is particularly disadvantageous within the scope of applying a method based on a quantitatively accurate geometric illustration of the regions to be examined in an examination object because this can significantly reduce the informative value of the generated images.

It is well known that phantoms provide an option for detecting geometric distortions that occur in a particular MR sequence. A phantom is a hollow base body that delimits an interior volume, into which a medium is filled; this is often water since this has permeability to radiation that is comparable to human tissue. However, there are strong variations in the signal intensity when carrying out MR imaging methods, particularly as a result of increases in dielectric effects when using high basic field strengths of the applied magnetic field above 3 tesla, which is why satisfactory results cannot be obtained with relatively large phantom volumes in the case of magnetic field strengths above 3 tesla. This is redressed by using oil instead of water as fluid filled into the phantom.

In the integrated application of MR- and PET-based imaging methods, there is a need to generate both PET imaging data with activity and MR imaging data using a phantom. By way of example, this may be required for testing the PET attenuation correction. In the process, the introduction and mixing of the activity of phantoms filled with oil is difficult because the activity is present dissolved in water; this leads to significantly increased temporal exposures of the operator.

In this context, it has been suggested to transfer the active liquid into an oil-water emulsion. However, this method leads to a significant radioactive exposure of the operator as a result of an increased temporal exposure. Furthermore, the options of MR imaging are limited by the so-called chemical shift of the oil.

DE 10 2005 045 679 B3 has disclosed a magnetic resonance imaging (MRI) arrangement with an MRI phantom and a method for determining the homogeneity of the magnetic field. Herein, an MRI phantom with a hollow base body that delimits an interior volume is separated by way of a separation element, as a result of which a main chamber and a partial chamber are created. Here, the main chamber is delineated from the partial chamber such that a gaseous bubble can enter the partial chamber as a result of a change in the spatial orientation of the MRI phantom in the gravitational field.

US 2008/02655882 A1 has disclosed an MRI- or an MRS-phantom, in which a plurality of subdivisions are provided in a phantom housing, which can each be filled separately with a fluid.

U.S. Pat. No. 4,818,943 has disclosed a phantom for imaging systems, wherein the phantom has a cylindrical housing with a central axis and a defined interior volume. Here, the interior volume is separated by means of separation elements, and so two chambers are created, which can be filled by different fluids.

SUMMARY

At least one embodiment of the invention specifies a phantom that can be used within the scope of magnetic resonance-based imaging methods, even at high basic field strengths.

According to at least one embodiment of the invention, a phantom is distinguished by the fact that the separation element or a section thereof consists of foam.

At least one embodiment of the invention is based on the idea of subdividing the interior volume, delimited by the base body of the phantom, into at least two volume portions by way of the at least one separation element because the dielectric effects are reduced as a result of the volume portions, which are smaller than the original interior volume, and the varying signal intensities can thus be reduced, particularly at high basic magnetic field strengths, for example above 3 tesla. This allows an improvement or a proper use of the phantom, particularly for detecting geometric distortions, even at high basic magnetic field strengths.

Subdividing the interior volume of the base body into at least two volume portions should not only be understood to mean a division within the meaning of halving the interior volume; the interior volume can equally be subdivided by the separation element into a plurality of volume portions with different sizes. Correspondingly, if the interior volume comprises a plurality of separation elements, the formation of a multiplicity of volume portions with the same or different sizes is feasible. It is likewise possible to form different subsets of volume portions with the same size. It follows that the interior volume of the phantom, delimited by the base body, can be subdivided into any type of volume portion by a suitable geometric design of the separation element or elements. The base body is preferably shaped like an ellipsoid, although other shapes are likewise possible. The separation element advantageously consists of a material that has a dielectric constant that is as small as possible.

In a development of at least one embodiment of the invention, at least one body forming a separate sub-volume can be arranged within the interior volume in addition to the separation element. According to this, the body should be considered a separate part that predominantly serves to represent certain tissue types, which is why it can be based on these in terms of shape and material. By way of example, the body can contain a fatty substance in the sub-volume enclosed thereby, or it may be formed of such a fatty substance.

Accordingly, the body may be embodied as a solid body or as a hollow body. An attachment of the body to a separation element or an edge on a wall of the base body is feasible. By way of example, adhesive bonding may be used for this purpose, with other measures serving for the attachment likewise being possible.

BRIEF DESCRIPTION OF THE DRAWINGS

Further advantages, features, and details of the invention emerge from the exemplary embodiments described below and from the drawings, in which.

DETAILED DESCRIPTION OF THE EXAMPLE EMBODIMENTS

Figure 1:
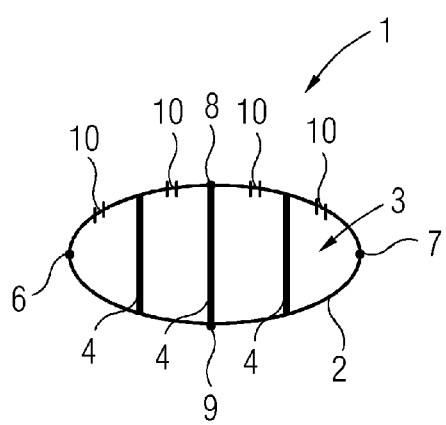
FIG. 1 shows, in a front view, a schematic diagram of a phantom according to the invention in a first embodiment.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Figure 2:
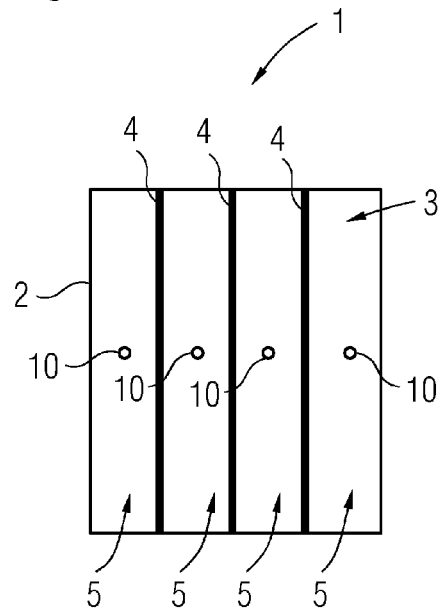
FIG. 2 shows a plan view of the embodiment as per FIG. 1.

FIG. 1 shows, in a front view, a schematic diagram of a phantom 1 according to invention in a first embodiment; FIG. 2 shows a corresponding plan view. It can be seen that the phantom 1 has a hollow base body 2, which delimits an interior volume 3 that is filled with water. Three separation elements 4 are arranged within the base body 2, which cross through the longitudinal sides of the latter and are each connected to the longitudinal sides of the phantom 1, and so the interior volume 3 is subdivided in four self-contained volume portions 5. This affords the possibility of compensating for dielectric effects, particularly in case of high basic magnetic field strengths, for example above three tesla, and so the phantom can still be used within the scope of both MR and PET imaging.

Each volume portion 5 formed by the separation elements 4 can be filled or emptied through a seal opening 10 assigned thereto.

The phantom 1 preferably has an elliptic cross section (cf. FIG. 1), with an exemplary spacing between opposing vertices on the semi-major axis 6, 7 of approximately 35 cm and an exemplary spacing between the vertices on the semi-minor axis 8, 9 of approximately 20 cm. The dimensions of the phantom 1 are for example approximately 15 to 25 cm in length. It goes without saying that other dimensions are possible; the shape of the phantom 1 can equally deviate from the elliptical shape, i.e. the phantom 1 could equally have a circular or rectangular cross section.

The separation elements 4 consist of closed-cell hard foam, for example on the basis of polyurethane, and have a small dielectric constant. At their free ends the separation elements 4 are bonded to the edges of the base body 2 of the phantom 1. By way of example, a separation element 4 has a thickness of approximately 8 mm. In addition to the embodiment of the separation elements 4 made from hard foam, a sandwich design of one or more or all separation elements 4 is equally feasible, with preference being for the cover layers to consist of foam and the central layer arranged therebetween being formed as a volume of only air such that this affords the possibility of imaging a lung segmentation that is similar to the human anatomy.

Figure 3:
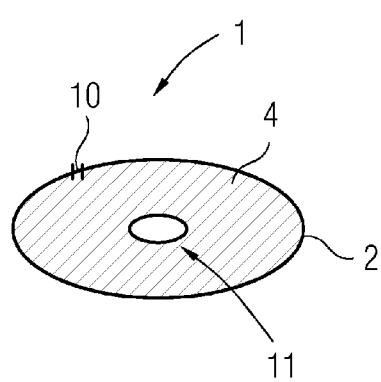
FIG. 3 shows, in a front view, a schematic diagram of a phantom according to the invention in a second embodiment.
Figure 4:
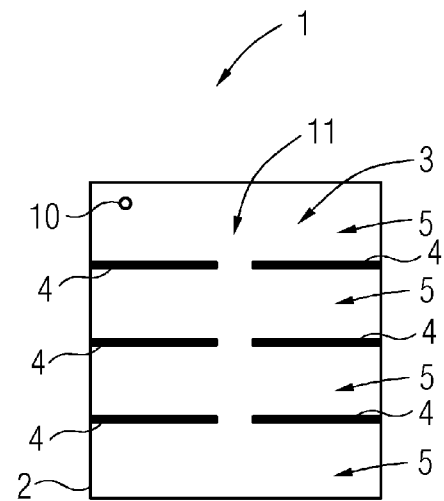
FIG. 4 shows a plan view of the embodiment as per FIG. 3.

FIG. 3 shows, in a front view, a schematic diagram of a phantom 1 according to the invention in a second embodiment; FIG. 4 shows a corresponding plan view of the phantom 1. The substantial difference to the embodiment shown previously in FIGS. 1 and 2 consists of a centrally arranged elliptical aperture-like opening 11 in each of the three disk-shaped separation walls 4 arranged in parallel one behind the other. Accordingly, communication is possible between the volume portions 5 formed by the separation elements 4, which equally means that the phantom 1 need only have a single filling opening 10 for filling the entire interior volume 3 with a liquid medium, in this case preferably water. The phantom 1 can still also be used at high basic magnetic field strengths as a result of the volume portions 5 that are designed such that they can communicate.

Figure 5:
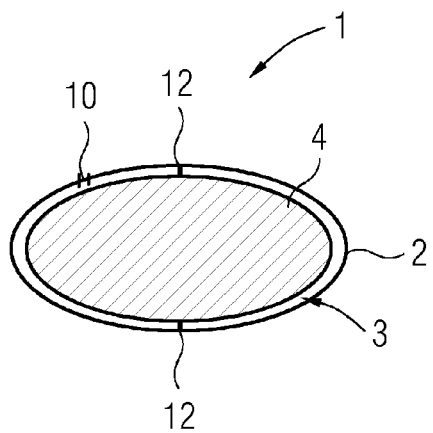
FIG. 5 shows, in a front view, a schematic diagram of a phantom according to the invention in a third embodiment.
Figure 6:
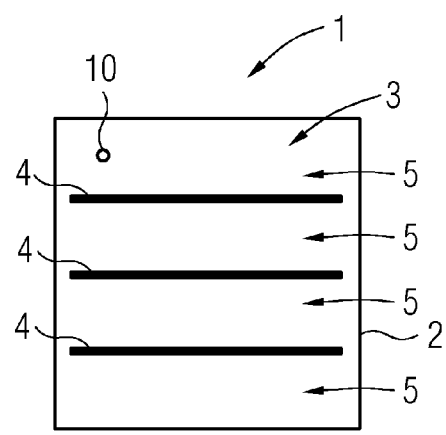
FIG. 6 shows a plan view of the embodiment as per FIG. 5.

FIGS. 5 and 6 show a further modification of the embodiment illustrated in FIGS. 1 and 2. In this case, the separation elements 4 are only connected to the edges of the base body 2 via attachment webs 12 formed on the edge in the vicinity of the vertices on the semi-minor axis. Analogously to the embodiment as per FIGS. 3, 4, this results in the option of communication between the individual volume portions 5 formed by the separation elements 4. In order to fill or empty the interior volume 3 of the phantom 1, merely one filling opening 10 is required.

Figure 7:
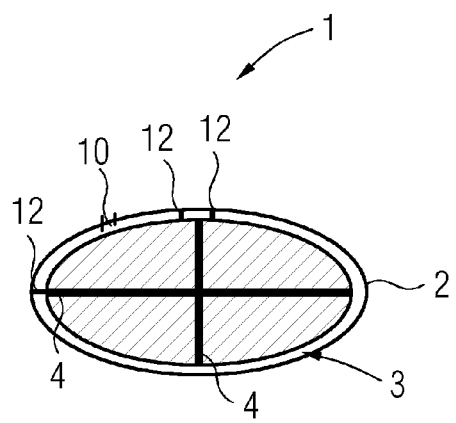
FIG. 7 shows, in a front view, a schematic diagram of a phantom according to the invention in a fourth embodiment.
Figure 8:
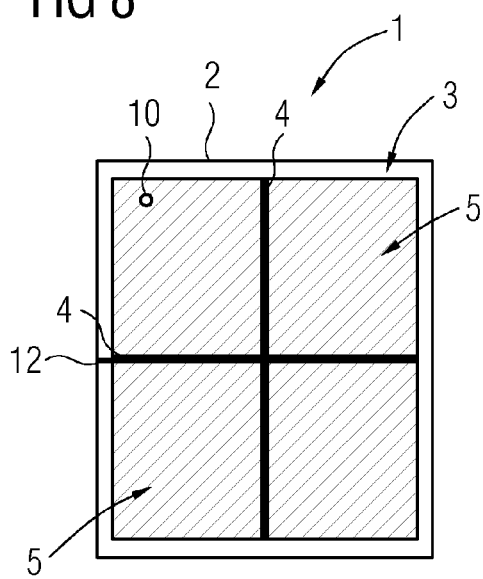
FIG. 8 shows a plan view of the embodiment as per FIG. 7.

The embodiment illustrated in FIGS. 7 and 8 is substantially characterized in that four plate-like separation elements 4 cross through the interior volume 3 of the base body along three mutually orthogonal spatial axes. The formed volume portions 5 equally communicate with one another because the separation elements 4 leave a gap to the respective edges of the base body 2 along each spatial axis. In accordance with the embodiment as per FIGS. 5 and 6, the separation elements are also connected to the base body 2 via individual attachment webs 12.

Figure 9:
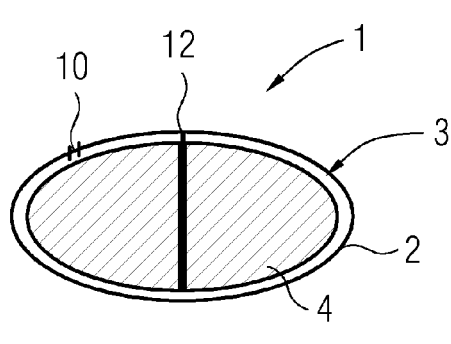
FIG. 9 shows, in a front view, a schematic diagram of a phantom according to the invention in a fifth embodiment.
Figure 10:
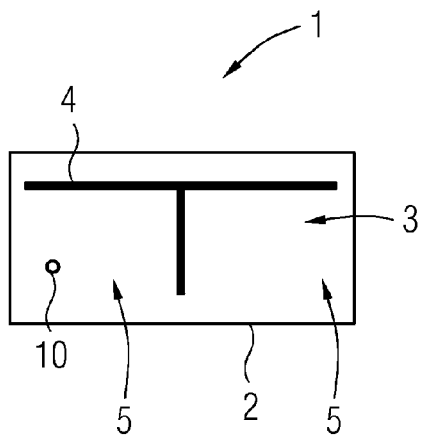
FIG. 10 shows a plan view of the embodiment as per FIG. 9.

The embodiment as per FIGS. 9 and 10 is distinguished by a separation element 4 with a T-shaped design within the interior volume 3 of the phantom 1. The separation element 4 itself accordingly extends along two spatial directions that are orthogonal to one another (cf. FIG. 10), and so the interior volume 3 of the phantom 1 is substantially subdivided into three volume portions 5 that communicate with one another.

Figure 11:
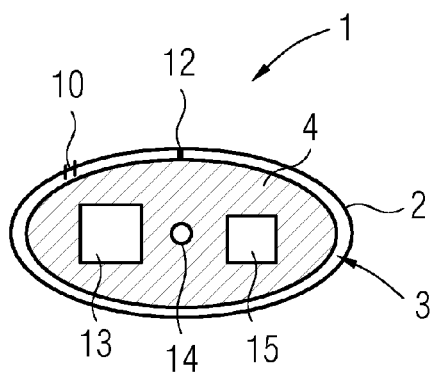
FIG. 11 shows, in a front view, a schematic diagram of a phantom according to the invention in a sixth embodiment.
Figure 12:
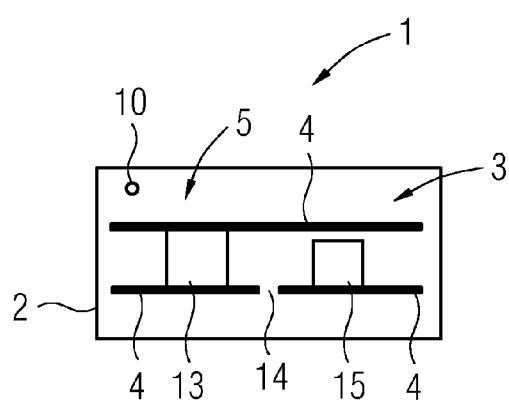
FIG. 12 shows a plan view of the embodiment as per FIG. 11.

In accordance with the sixth embodiment shown in FIGS. 11 and 12, the separation elements 4 arranged within the interior volume 3 of the phantom 1 implement a type of sandwich design, wherein the two separation elements 4 extending in parallel are connected centrally by a separation element 4, which forms a cubic hollow body 13 and itself has an interior volume filled with air. By way of example, this allows the representation of a lung by means of the phantom 1 according to the invention. Furthermore, an aperture-like opening 14 or a hole is provided in the separation element 4 illustrated at the bottom in FIG. 12.

A hollow body 15 filled with a fatty substance is attached to the separation element 4 arranged at the bottom in FIG. 12. By way of example, this can be brought about by adhesive bonding. In principle, the hollow body 15 can be filled with selected materials for imaging different tissue types of the human body. It goes without saying that the hollow body 15 could also be arranged on the edge of the base body 2 of the phantom 1.

A tube-like filling channel, which allows the hollow body 15 situated in the interior volume 3 of the phantom 1 to be filled from outside of the phantom 1 with a corresponding substance, has not been illustrated. Similarly, a corresponding filling channel could also be connected to the hollow-body-like separation element 13, wherein provision would in each case be made for corresponding filling openings on the edge of the base body 2 of the phantom 1.

An embodiment of the invention specifies a phantom that can be used within the scope of magnetic resonance-based imaging methods, even at high basic field strengths.

According to an embodiment of the invention, a phantom is distinguished by the fact that the separation element or a section thereof consists of foam.

An embodiment of the invention is based on the idea of subdividing the interior volume, delimited by the base body of the phantom, into at least two volume portions by way of the at least one separation element because the dielectric effects are reduced as a result of the volume portions, which are smaller than the original interior volume, and the varying signal intensities can thus be reduced, particularly at high basic magnetic field strengths, for example above 3 tesla. This allows an improvement or a proper use of the phantom, particularly for detecting geometric distortions, even at high basic magnetic field strengths.

Subdividing the interior volume of the base body into at least two volume portions should not only be understood to mean a division within the meaning of halving the interior volume; the interior volume can equally be subdivided by the separation element into a plurality of volume portions with different sizes. Correspondingly, if the interior volume comprises a plurality of separation elements, the formation of a multiplicity of volume portions with the same or different sizes is feasible. It is likewise possible to form different subsets of volume portions with the same size. It follows that the interior volume of the phantom, delimited by the base body, can be subdivided into any type of volume portion by a suitable geometric design of the separation element or elements. The base body is preferably shaped like an ellipsoid, although other shapes are likewise possible. The separation element advantageously consists of a material that has a dielectric constant that is as small as possible.

According to an embodiment of the invention, a separation element or a section thereof consists of foam. Foam can be produced with various densities, cell sizes, degrees of hardness etc. from different materials and, accordingly, with a spectrum of properties. According to an embodiment of the invention, closed-cell hard foams are preferred, for example based on polyurethane, for use as material for the separation element. It goes without saying that, in principle, all types of foam, such as e.g. plastics foams, mineral foams, etc. are feasible for forming the separation element.

The separation element can be embodied such that the volume portions communicate with one another or such that the volume portions are completely separated from one another. In the case of volume portions that communicate with one another, the entire phantom can be filled or, if need be, emptied over a single filling opening, as outlined further below. The possible increases in dielectric effects caused by the communicating volume portions can be tolerated. Completely isolated volume portions do not exhibit these effects, but it is more complicated to fill or empty them.

In a development of an embodiment of the invention, the separation element can, at least in sections, be connected on its edge to the base body. Accordingly, it is feasible for the separation element to be connected to the edge of the base body such that communication between the volume portions is possible or that there are at least two volume portions completely separated from one another. In the latter case, the separation element is connected to the edge of the base body at least two points, i.e. for example a volume portion is enclosed by the separation element and the edge section extending between the two connection points of the separation element with the edge of the base body.

The separation element can have at least one aperture-like opening in its surface or have at least one recess on its edge. In the latter case, communication is established by the correspondingly designed separation element(s) between the volume portions formed thereby. By way of example, the recess on its edge can be such that it is embodied to encircle, almost entirely, the separation element such that the latter is or can be merely attached to the edge of the base body via a projection, approximately like an attachment web. Equally, provision can for example be made for corresponding recesses with a regular or irregular arrangement in the circumferential direction of the separation element. Alternatively, or in addition thereto, provision can be made for at least one opening in the surface area of the separation element. The opening can have various designs and can, for example but not exclusively, assume a circular or quadrilateral shape. It goes without saying that the discourse also holds true for a plurality of separation elements arranged in the base body.

The separation element can have a disk-like shape and/or can have a three-dimensional shape and/or can be embodied as a hollow body forming at least one closed-off separate sub-volume within the interior volume. The disk shape of the separation element predominately extends in two spatial directions through the interior volume of the base body, wherein the third spatial direction is substantially given by the thickness of the separation element and substantially subdivides the latter into two volume portions. Communication between the volume portions formed thus may or may not be possible, in accordance with the dimensions of the disk. By way of example, three-dimensional shapes emerge from bending, arcing, or otherwise deforming a disk. In principle, the separation element in the process extends, regularly or irregularly, along three, mutually orthogonal spatial axes. A hollow body, which is formed by the separation element itself and delimits a closed-off separate interior volume, may for example by provided by a cubic or spherical or ellipsoidal embodiment of the separation element. Other geometries of the hollow-body-like separation element that likewise form a closed-off separate interior volume are likewise feasible. Analogously to what was discussed above, a hollow-body-like separation element can likewise have different separation elements in its interior volume.

In the process, it is advantageous if the interior volume formed by the separation element with the hollow-body-like design can be filled with a liquid medium via at least one separate filling opening. Accordingly, a medium can be supplied to or discharged from the interior volume. If need be, provision can be made for tube-like filling channels, which, for example, extend from a filling opening of the base body on the edge to the filling opening of the separation element with the hollow-body-like design via the interior volume of the base body.

It is furthermore possible for a separation element to comprise a plurality of sections arranged in different spatial planes and/or arranged parallel to one another, and/or a plurality of separation elements to be arranged in different spatial planes and/or arranged parallel to one another. Accordingly, the interior volume of the base body can be subdivided into volume portions embodied in a plurality of dimensions. Here, a separation element itself can be designed such that it extends in the interior volume, or in part of the interior volume, in corresponding spatial planes or e.g. in a meandering fashion with sections that run substantially parallel to one another. Additionally, in the case of a plurality of separation elements, these can be arranged at an angle to one another, e.g. orthogonally, in corresponding spatial positions. By way of example, a stack-like parallel arrangement of a plurality of separation elements is equally feasible. Overall, different subdivisions of the interior volume into appropriate volume portions are possible in the three-dimensional space formed by the interior volume.

In a development of an embodiment of the invention, a separation element can have a plurality of sections made of different materials and/or a plurality of separation elements can be made of different materials. The first case relates to a segment-like subdivision of the separation element into different sections that form the latter, which section differ in terms of their material, i.e. the sections are formed from different materials and stably interconnected by adhesive bonding, welding, soldering, or the like. Mechanical connection device(s) for connecting the sections forming the separation element are likewise feasible. Moreover, it is possible to form one or more separation elements from the same material but with different property gradients. If a plurality of separation elements are arranged within the base body, it is possible for these to be embodied equivalently or differently in respect of the respectively utilized material. The material(s) forming the separation element or elements advantageously have a small dielectric constant.

Additionally, the separation element can be subdivided into segment-like sections that consist of different foams. This should equally be understood to mean that the properties of a type of foam differ in different sections of the separation element and so the separation element for example has a density gradient. The foam or foams preferably have a small dielectric constant.

The separation element or a section thereof can likewise have a sandwich design. The sandwich design is known, inter alia, from lightweight construction and is substantially distinguished by two cover layers, which absorb force, surrounding a central layer from above and below. In relation to their weight sandwich designs have good mechanical properties and, more particularly, are very rigid. The central layer can expediently be formed by an air pocket, as a result of which, for example, there is the option of forming a lung segmentation as per different anatomical specifications. It goes without saying that other sandwich designs are also feasible. Like above, the sandwich design is used to aim for a dielectric constant of the separation element that is as small as possible.

There is no need for the separation element to be constructed completely with a sandwich design; rather, it can consist of individual separate or contiguous sections that have a sandwich design.

In a development of an embodiment of the invention, at least one body forming a separate sub-volume can be arranged within the interior volume in addition to the separation element. According to this, the body should be considered a separate part that predominantly serves to represent certain tissue types, which is why it can be based on these in terms of shape and material. By way of example, the body can contain a fatty substance in the sub-volume enclosed thereby, or it may be formed of such a fatty substance. Accordingly, the body may be embodied as a solid body or as a hollow body. An attachment of the body to a separation element or an edge on a wall of the base body is feasible. By way of example, adhesive bonding may be used for this purpose, with other measures serving for the attachment likewise being possible.

If the body is embodied as a hollow body, it is expedient if the sub-volume formed thereby can be filled with a medium via at least one separate filling opening. If need be, the filling opening of the interior volume formed by the separate hollow body is connected to a filling opening, appropriately formed on the base body, via a tube-like filling channel extending through the interior volume of the base body of the phantom, and so this provides an option, as described below, for supplying media to, or discharging media from, the interior volume of the separate hollow body.

The interior volume can preferably be filled with a liquid medium, more particularly water, via at least one filling opening. Accordingly, this filling opening is used to fill the phantom with a liquid medium, i.e. the liquid medium is filled into the base body of the phantom, which results in the operability of the phantom. The liquid medium is preferably water, although other liquids can also be filled into the base body of the phantom in exceptional circumstances. If the phantom has volume portions that communicate with one another, there is the option of filling the entire interior volume through a single filling opening, as mentioned above. By contrast, if provision is made for mutually separate volume portions, they each have to be filled by separate filling openings. It goes without saying that each filling opening can be sealed using suitable sealing means and so inadvertent outflow of the liquid from the phantom is rendered impossible.

A phantom as described above can more particularly be filled with water to which a radioactive substance has been added. The radioactive substance can generate activity that can be detected in a PET scanner. Such a phantom can therefore more particularly be used to calibrate, maintain, check, and/or commission a MRI/PET hybrid scanner. As described above, it is particularly suited to MR imaging and, at the same time, to PET imaging and can be handled easily and safely.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:
1. A phantom, comprising:
   a hollow base body that delimits an interior volume, the interior volume being subdivided into at least two vol- ume portions by at least one separation element, at least a section of the at least one separation element consisting of foam.

2. The phantom as claimed in claim 1, wherein the at least one separation element is embodied such that the volume portions are completely separated from one another.

3. The phantom as claimed in claim 1, wherein the at least one separation element is, at least in sections, connected on an edge of the at least one separation element to the base body.

4. The phantom as claimed in claim 2, wherein the at least one separation element at least one of:
   includes at least one aperture-like opening in a surface of the at least one separation element; and
   includes at least one recess on an edge of the at least one separation element.

5. The phantom as claimed in claim 1, wherein the at least one separation element at least one of:
   includes a disk-like shape;
   has a three-dimensional shape; and
   is embodied as a hollow body forming at least one closed-off separate sub-volume within the interior volume.

6. The phantom as claimed in claim 5, wherein the at least one separation element is embodied as a hollow body forming at least one closed-off separate sub-volume within the interior volume and the at least one closed-off separate sub-volume is fillable with a liquid medium via at least one separate filling opening.

7. The phantom as claimed in claim 1, wherein the separation element comprises at least one of:
   at least one of a plurality of sections arranged in different spatial planes and a plurality of sections arranged parallel to one another; and
   at least one of a plurality of separation elements arranged in different spatial planes and arranged parallel to one another.

8. The phantom as claimed in claim 1, wherein the separation element includes at least one of
   a plurality of sections made of different materials; and
   a plurality of separation elements made of different materials.

9. The phantom as claimed in claim 1, wherein the separation element or a section of the separation element has a sandwich design.

10. The phantom as claimed in claim 1, wherein at least one body forming a separate sub-volume is arranged within the interior volume in addition to the separation element.

11. The phantom as claimed in claim 10, wherein the body is a hollow body and the sub-volume formed thereby is fillable with a medium via at least one separate filling opening.

12. The phantom as claimed in claim 1, wherein the interior volume is fillable with a liquid medium via at least one filling opening.

13. The phantom as claimed in claim 1, wherein the phantom is for use in magnetic resonance (MR)- or positron emission tomography (PET)-based imaging methods.

14. The phantom as claimed in claim 2, wherein the at least one separation element is, at least in sections, connected on an edge of the at least one separation element to the base body.

15. The phantom as claimed in claim 3, wherein the at least one separation element at least one of:
   includes at least one aperture-like opening in a surface of the at least one separation element; and
   includes at least one recess on the edge.

16. The phantom as claimed in claim 14, wherein the at least one separation element at least one of:
   includes at least one aperture-like opening in a surface of the at least one separation element; and
   includes at least one recess on the edge.

17. The phantom as claimed in claim 12, wherein the liquid medium is water.

18. The phantom as claimed in claim 1, wherein the at least one separation element is filled with foam.

19. The phantom as claimed in claim 1, wherein a section of the at least one separation element is filled with foam.

20. The phantom as claimed in claim 1, wherein the at least one separation element is embodied such that the volume portions communicate with one another.

\* \* \* \* \*